United States Patent [19]

Chitwood et al.

[11] Patent Number: 5,166,864

[45] Date of Patent: Nov. 24, 1992

[54] PROTECTED CIRCUIT CARD ASSEMBLY AND PROCESS

[75] Inventors: Gary L. Chitwood, Anaheim; James E. Balcom, Garden Grove, both of Calif.

[73] Assignee: Hughes Aircraft Company, Los Angeles, Calif.

[21] Appl. No.: 701,942

[22] Filed: May 17, 1991

[51] Int. Cl.$^5$ .......................... H05N 7/20; H05N 9/00
[52] U.S. Cl. .................... 361/386; 174/35 R; 174/35 MS; 361/387; 361/424
[58] Field of Search .................. 174/35 R, 35 MS, 51; 361/386-389, 397, 401, 402, 414, 424

[56] References Cited

U.S. PATENT DOCUMENTS

| | | | |
|---|---|---|---|
| 3,179,854 | 4/1965 | Luedicke et al. | 361/386 |
| 3,616,533 | 11/1971 | Heap et al. | 361/387 |
| 4,707,763 | 11/1987 | Kudo | 361/386 |
| 4,739,453 | 4/1988 | Kurokawa | 361/424 |
| 4,792,879 | 12/1988 | Bauknecht | 361/424 |

FOREIGN PATENT DOCUMENTS 0078299  3/1990  Japan .................................. 361/424

Primary Examiner—Gregory D. Thompson
Attorney, Agent, or Firm—Wanda K. Denson-Low

[57] ABSTRACT

Printed wiring board with components thereon is enclosed with a dielectric conformal coating over the printed wiring and the components. Enclosure includes a metal layer over the conformal coating and the ground plane of the card to form a protected circuit card assembly.

16 Claims, 1 Drawing Sheet

PROTECTED CIRCUIT CARD ASSEMBLY AND PROCESS

FIELD OF THE INVENTION

This invention is directed to an electronic circuit card which has thereon a conformal dielectric coating together with a metallic coating thereover for additional mechanical strength, heat transfer and isolation from electromagnetic interference.

BACKGROUND OF THE INVENTION

Printed wiring boards are made of dielectric material and have traces thereon of conductive material which form printed wiring. Intricate wiring can be formed in this way. Multiple layers are provided in complex cases. Discrete components and/or integrated circuit packages are mounted on such boards. The conductors on the component packages extend through openings in the board and are electrically and mechanically connected to the board and its printed wiring by means of soldering. Quite often wave soldering is applied to the side of the board opposite the side on which the components and packages are mounted. This creates a circuit card assembly. The circuit card assembly is interconnected with other electrical and electronic structure by means of connectors associated with the circuitry.

Mechanical protection of such circuit card assemblies is desirable. In addition, it is desirable to protect such circuit card assemblies from electromagnetic interference. Accordingly, such circuit card assemblies can be improved.

SUMMARY OF THE INVENTION

In order to aid in the understanding of this invention, it can be stated in essentially summary form that it is directed to a circuit card assembly and process wherein the circuit card assembly is coated at least on its component side with a dielectric conformal coating and the coating carries thereon a metallic layer so that the metallic layer serves as mechanical protection, electromagnetic interference protection and serves to withdraw heat from the components and/or packages on the component side of the card.

It is thus a purpose and advantage of this invention to provide a circuit card assembly which has a conformal dielectric coating on the component side of the circuit card together with a metallic layer thereover so as to achieve isolation between the circuit card assembly and exterior electron, magnetic and mechanical influences.

It is another purpose and advantage of this invention to provide a process which will provide electromagnetic interference protection to a circuit card assembly without the need for the machining of specifically shaped covers to accommodate for the components on the circuit card assembly.

It is another purpose and advantage of this invention to provide additional structural integrity to the attachment of components and packages to the printed wiring board to increase the life of the circuit card assembly in adverse environments.

It is a further purpose and advantage of this invention to provide a heat conducting coating on the circuit card assembly so as to permit the conduction of heat away from components on the circuit card.

Other purposes and advantages of this invention will become apparent from a study of the following portion of this specification, the claims and the attached drawings wherein:

DESCRIPTION OF THE PREFERRED EMBODIMENT

Figure 1:
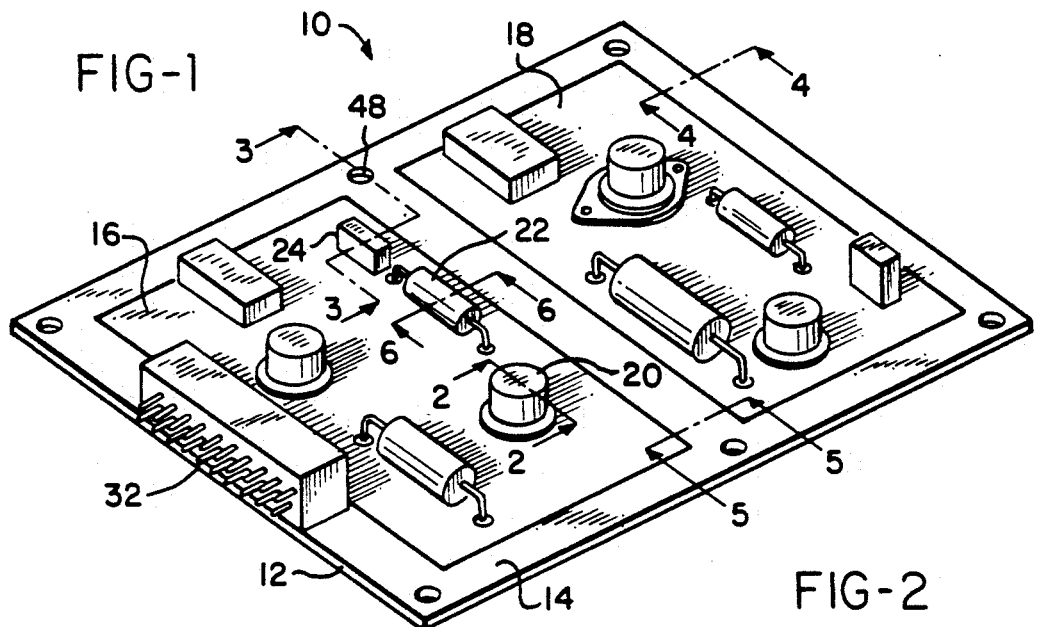
FIG. 1 is an isometric view of a circuit card assembly suitable for protection in accordance with this invention.

The protected circuit card assembly of this invention is generally indicated at 10 in FIG. 1. The assembly 10 includes a printed wiring board 12. The printed wiring board 12 comprises a dielectric board with printed wiring thereon. The printed wiring may be on the top and/or bottom surfaces of the board 12, as seen in FIG. 1. Furthermore, the board 12 may be a multi-layer board with printed wiring in the intermediate layers. Such boards are used for more complex circuitry. The top of the dielectric board 12 has a ground plane 14 on its upper surface around the peripheral edge and across the center of the board. The ground plane 14 remains after etching defines the circuit traces in the copper layer bonded to the dielectric board. Within the outlines of the ground plane 14, the bonded copper layer has been etched to form the printed wiring on the upper surface of the board. This printed wiring is not shown, but is within the two zones 16 and 18 shown in FIG. 1.

Various components are mounted on the board 12 and form part of the assembly 10. These components include a discrete transistor housing 20, a capacitor 22, and an integrated circuit module 24. These components are shown in FIG. 1 and are individually shown in FIGS. 2, 6 and 3. Each of the components has leads thereon which extend through vias in the board 12 and are soldered to pads and/or printed wiring on the lower side of the board, in conventional manner. As an example, the board is 0.062 inch thick. These three components are illustrative of various types of electronic components, and other sizes and shapes are also shown in FIG. 1.

Figure 5:
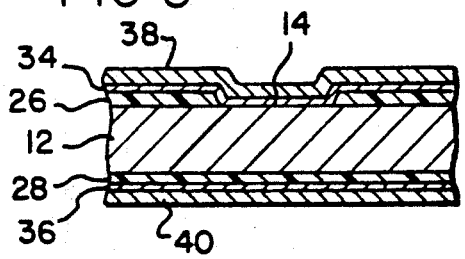
FIG. 5 is an enlarged section taken generally along line 5—5 of FIG. 1 showing the same circuit card assembly after the protection is applied thereto.
Figure 6:
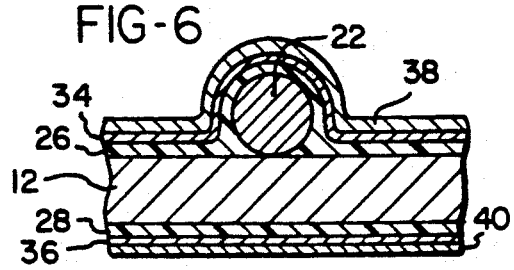
FIG. 6 is an enlarged section taken generally along line 6—6 of FIG. 1 showing the same circuit card assembly after the protection is applied thereto.

To protect the above-described circuit card assembly 10, a dielectric conformal coating is applied to both surfaces of the assembly. The upper layer of conformal coating is indicated at 26 in FIGS. 2, 3, 4, 5 and 6. The lower layer is indicated at 28 in FIGS. 2, 3, 5 and 6. These upper and lower layers of conformal coating are of dielectric synthetic polymer composition material, such as polyurethane. It is evenly applied to all surfaces, except for places from which it is masked, as described below. As an example, the conformal coating layers are 0.001 to 0.005 inch thick. The conformal coating fills the undercuts, such as under the cylindrical capacitor 22, as seen in FIG. 6.

Figure 3:
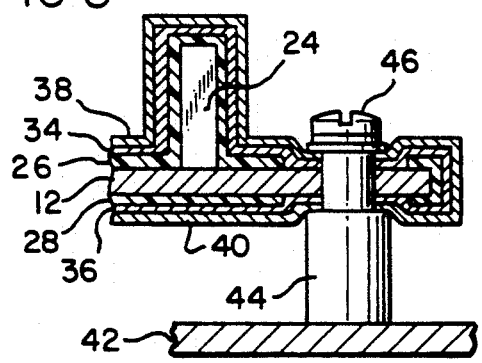
FIG. 3 is an enlarged section taken generally along line 3—3 of FIG. 1 showing the same circuit card assembly after the protection is applied thereto.
Figure 4:
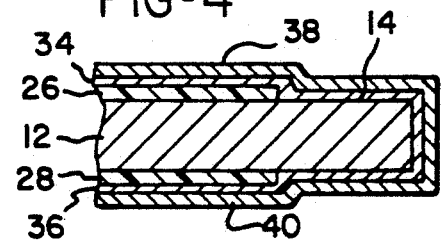
FIG. 4 is an enlarged section taken generally along line 4—4 of FIG. 1 showing the same circuit card assembly after the protection is applied thereto.

The conformal coating is masked away from those areas where heat extraction is desired and where electrical connection is desired. For example, the top of transistor housing 20 is masked during the application of the conformal coating to leave an opening defined by edge 30. When the masking is removed, the top of the transistor housing 20 is still exposed. Similarly, the edges of the printed wiring board are masked to leave exposed the ground plane 14 around the edges, as seen in FIGS. 3 and 4, and leave exposed the ground plane where it crosses the printed wiring board between zones 16 and 18, as seen in FIG. 5. After the application of the conformal coating layer, its curing and the removal of the masking, the first metal layer is applied to the entire structure. However, it is understood that the connector 32, seen in FIG. 1, or other connectors on the assembly remain masked until completion of the assembly. The first metal layer applied is an upper flash layer 34 and a lower flash layer 36. These layers may be vacuum-deposited copper, usually quite thin such as 0.0001 inch, and the purpose is to permit plating over the dielectric conformal layer. After application of the flash layer, upper and lower plated layers 38 and 40 are applied. The upper and lower plated layers are applied by conventional plating methods, such as by an electroless method. Nickel is a suitable material because it has significant mechanical strength as well as sufficient conductivity for electromagnetic interference protection. A plated nickel layer of a thickness of 0.020 inch is considered suitable. More than two metallic layers can be applied if different metals or greater thickness is desirable.

Figure 2:
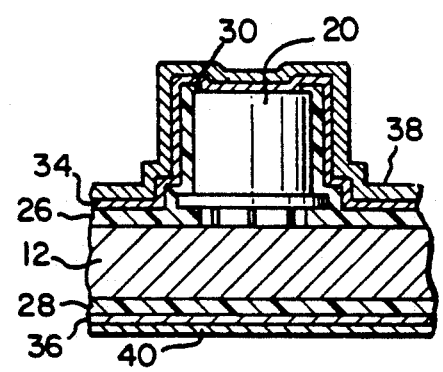
FIG. 2 is an enlarged section taken generally along line 2—2 of FIG. 1 showing the same circuit card assembly after the protection is applied thereto.

It must be noted that certain areas were masked off. The masking off of the edge of the ground plane, as shown in FIG. 4, permits the metallic flash and plated layers to bond directly to the metal of the ground plane. Thus, the exterior of the protected circuit card assembly is also at circuit ground potential. Since the ground plane cross bar shown in FIG. 5 had been masked, the flash and plated layers also bond thereto, thus creating separate zones on the circuit card assembly which are isolated from each other by means of the protection provided by the plated layers. FIG. 2 shows how the top of the transistor housing is bonded to the flash and plated layers for heat removal from the transistor housing into those layers.

Heat can be extracted from the circuit card assembly, with its protective layers thereon, by any convenient means. Base plate 42 is cooled by any convenient means. It carries a metallic stud 44 thereon. Cap screw 46 engages through a hole 48 in the printed wiring board and clamps the printed wiring board and its layers to the stud 44. As seen in FIG. 1, there are six such mounting holes, and six such studs and cap screws may be employed to secure the circuit card assembly 10 in place. Heat extraction is by conduction through the protective layers and through the studs to the base plate. When the circuit card assembly is complete and has its metallic layers applied, masking is removed from the connector 32, and the protected circuit card assembly is ready for service.

With the circuit card assembly thus protected, it is difficult to repair the circuit card assembly. For this reason, the protected circuit card assembly is most useful in areas which will not receive maintenance, such as in satellites and space vehicles. Furthermore, in such uses, conductive heat transfer is important. In ground-based applications, the circuit card assembly can be employed where plug-in type repair is conveniently achieved.

This invention having been described in its presently contemplated preferred embodiment, it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A protected circuit card assembly comprising:
a printed wiring board having printed wiring thereon;
electrical components mounted on at least one side of said printed wiring board and electrically connected to the printed wiring thereon;
a dielectric conformal coating extending substantially continuously over said components and said printed wiring on said printed wiring board, said conformal coating not covering a portion of at least some of said components where electrical contact to said components is desired, said conformal coating not covering a portion of at least some of said components where heat removal is desired; and
at least one metallic layer disposed on said dielectric conformal coating so as to protect said printed wiring board and said components thereon from electromagnetic interference effects and from mechanical damage.

2. The protected circuit card assembly of claim 1 wherein said at least one metallic layer is further disposed on the portion of said components not coated with said dielectric conformal coating.

3. The protected circuit card assembly of claim 1 wherein said printed wiring board has a peripheral edge and has an electrically conductive ground plane adjacent said edge, said at least one metallic layer being in direct contact with at least a portion of said ground plane so that said at least one metallic layer is at the same potential as said ground plane.

4. The protected circuit card assembly of claim 3 wherein said ground plane extends around the entire periphery of said printed wiring board and said at least one metallic layer is in direct contact with said ground plane around the entire periphery of said printed wiring board so that said components on said printed wiring board are completely metallically enclosed.

5. The protected circuit card assembly of claim 4 wherein said conformal coating layer is a layer of thermosetting synthetic polymer composition material and wherein said at least one metallic layer includes a first metallic flash layer thereon and a second metallic layer plated onto said first metallic flash layer.

6. The protected circuit card assembly of claim 1 wherein said conformal coating layer is a layer of thermosetting synthetic polymer composition material and wherein said at least one metallic layer includes a first metallic flash layer thereon and a second metallic layer plated onto said first metallic flash layer.

7. The protected circuit card assembly of claim 6 wherein said dielectric conformal coating layer extends substantially around both sides of said printed wiring board and substantially over said components thereon and said at least one metallic layer extends around both sides of said printed wiring board and said components thereon to completely enclose said circuit card assembly to protect said circuit card assembly.

8. The protected circuit card assembly of claim 7 wherein said at least one metallic layer is coupled to a heat sink means.

9. A protected circuit card assembly comprising:
a printed wiring board, a ground plane extending around the periphery of said printed wiring board, printed wiring on said printed wiring board within said ground plane, a plurality of electronic components mounted on said printed wiring board and electrically connected to said printed wiring to form a circuit card assembly;
a conformal dielectric layer extending at substantially over said printed wiring on said printed wiring board and substantially over said components on said printed wiring board so as to leave at least a portion of said ground plane exposed, said conformal coating not covering a portion of at least some of said components where electrical contact to said components is desired, said conformal coating not covering a portion of at least some of said components where heat removal is desired; and
a metallic layer overlaying said conformal coating and attached to said ground plane so as to enclose said printed wiring and said components beneath said metallic layer to protect said printed wiring and said components from electromagnetic interference and from mechanical damage.

10. The protected circuit card assembly of claim 9 wherein said conformal coating is positioned on both sides of said printed wiring board and said metallic layer extends over all of said conformal dielectric coating.

11. The protected circuit card assembly of claim 9 further including mounting means for engagement on said metallic layer where it lies on said ground plane for extracting heat from said protected circuit card assembly.

12. The protected circuit card assembly of claim 11 wherein there is a metallic flash layer deposited on said conformal coating so that said metallic layer can be electrodeposited thereon.

13. The method of making a printed circuit card assembly comprising:
forming a circuit card having printed wiring on at least one side thereof and components on said circuit card electrically connected to the wiring;
masking at least a portion of the components;
depositing a dielectric conformal coating over the printed wiring and the portion of the components that has not been masked
unmasking masked components;
non-electrically depositing a first metallic layer over the conformal dielectric coating and the unmasked components; and
electrodepositing a second metallic layer on said first metallic layer to provide electromagnetic interference protection to the printed wiring and components thereon.

14. The method of claim 13 wherein the formation of the circuit card includes the formation of a ground plane around the periphery thereof and the step of depositing a conformal dielectric coating excludes depositing the conformal dielectric coating on at least part of the peripheral ground plane so that the electrodeposition of the electromagnetic interference layer includes electrodepositing the layer on the ground plane.

15. The method of claim 13 wherein the formation of the circuit card includes the formation of a ground plane around the periphery thereof and the step of depositing a conformal dielectric coating excludes depositing the conformal dielectric coating on at least part of the peripheral ground plane so that the electrodeposition of the electromagnetic interference layer includes electrodepositing the layer on the ground plane.

16. The method of claim 13 wherein the formation of the circuit card includes the formation of a ground plane across the card to divide the printed wiring on the card into two zones;
the deposition of dielectric conformal coating includes excluding the conformal coating from the ground plane and the step of depositing the electromagnetic interference layer includes depositing it on the ground plane so as to separately protect the two zones on the circuit card assembly.

* * * * *